(12) United States Patent
Kim et al.

(10) Patent No.: US 12,052,862 B2
(45) Date of Patent: Jul. 30, 2024

(54) MICROELECTRONIC DEVICES INCLUDING STACK STRUCTURES HAVING AIR GAPS, AND RELATED MEMORY DEVICES, ELECTRONIC SYSTEMS, AND METHODS

(71) Applicant: Micron Technology, Inc., Boise, ID (US)

(72) Inventors: Byeung Chul Kim, Boise, ID (US); Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 318 days.

(21) Appl. No.: 17/549,237

(22) Filed: Dec. 13, 2021

(65) Prior Publication Data

US 2023/0189515 A1 Jun. 15, 2023

(51) Int. Cl.
| | | |
|---|---|---|
| H01L 27/11556 | (2017.01) |
| G11C 5/02 | (2006.01) |
| H01L 23/538 | (2006.01) |
| H10B 41/27 | (2023.01) |
| H10B 43/27 | (2023.01) |

(52) U.S. Cl.
CPC ............. *H10B 41/27* (2023.02); *G11C 5/025* (2013.01); *H01L 23/5386* (2013.01); *H10B 43/27* (2023.02)

(58) Field of Classification Search
CPC ..... G11C 5/025; H01L 23/5386; H10B 41/27; H10B 43/50; H10B 43/27
See application file for complete search history.

(56) References Cited

U.S. PATENT DOCUMENTS

| | | | |
|---|---|---|---|
| 10,002,787 B2* | 6/2018 | Yu ..................... | H01L 21/76834 |
| 2018/0330985 A1* | 11/2018 | Yu ........................... | H10B 43/50 |
| 2021/0343736 A1* | 11/2021 | Surthi .................... | G11C 5/025 |
| 2022/0278051 A1* | 9/2022 | Scarbrough ............ | H10B 43/27 |

* cited by examiner

*Primary Examiner* — Jaehwan Oh
(74) *Attorney, Agent, or Firm* — TraskBritt

(57) ABSTRACT

A microelectronic device comprises a stack structure, a staircase structure, an etch stop material, and insulative material. The stack structure comprises conductive structures, and air gaps vertically alternating with the conductive structures. The staircase structure is within the stack structure and has steps comprising edges of at least some of the conductive structures of the stack structure. The etch stop material continuously extends over the conductive structures and at least partially defines horizontal boundaries of the air gaps. The insulative material overlies the etch stop material. Additional microelectronic devices, memory devices, electronic systems, and methods are also disclosed.

24 Claims, 11 Drawing Sheets

MICROELECTRONIC DEVICES INCLUDING STACK STRUCTURES HAVING AIR GAPS, AND RELATED MEMORY DEVICES, ELECTRONIC SYSTEMS, AND METHODS

TECHNICAL FIELD

Embodiments of the disclosure generally relate to microelectronic device design and fabrication. In particular, embodiments of the disclosure relate to microelectronic devices including stack structures having air gaps, and to associated memory devices, electronic systems, and methods.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, non-volatile memory (NVM) devices, such as flash memory devices (e.g., NAND flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including structures of conductive structures and dielectric materials. Each vertical memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

In some cases, chemical erosion, which can result from etching processes, undesirably effectuates voids in insulative structures associated with a vertical memory array. The voids may negatively impact the structural integrity of a device including the vertical memory array. In some cases, one or more tiers of structures associated with the vertical memory array may undesirably collapse during the formation process, such as during or after so called "replacement gate" processing.

BRIEF DESCRIPTION OF THE DRAWINGS

While the specification concludes with claims particularly pointing out and distinctly claiming embodiments of the present disclosure, the advantages of embodiments of the disclosure may be more readily ascertained from the following description of embodiments of the disclosure when read in conjunction with the accompanying drawings in which:

DETAILED DESCRIPTION

Figure 1A:
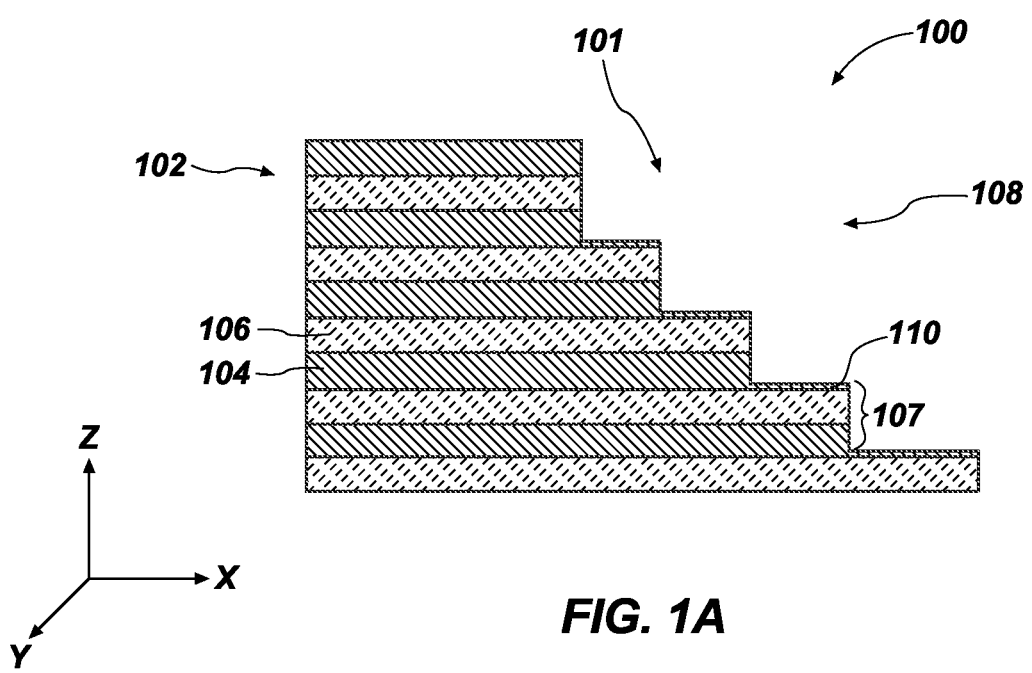
FIGS. 1A through FIG. 1F illustrate simplified, partial side cross-sectional views of a microelectronic device structure at different processing stages of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional non-volatile memory; conventional volatile memory), but also includes an application specific integrated circuit (ASIC) (e.g., a system on a chip (SoC)), a microelectronic device combining logic and memory, and a graphics processing unit (GPU) incorporating memory.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yHz$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yHz$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIGS. 1A through IF are simplified, partial side cross-sectional views of a microelectronic device structure 100 at different processing stages of a method of forming a microelectronic device (e.g., a memory device, such as a 3D NAND Flash memory device), in accordance with embodiments of the disclosure. FIG. 1A illustrates a simplified, partial cross-sectional view of the microelectronic device structure 100 at a relatively early processing stage of the method of forming a microelectronic device. As shown in FIG. 1A, the microelectronic device structure 100 may be formed to include a preliminary stack structure 102 including insulative structures 104 and sacrificial structures 106 (e.g., additional dielectric structures) vertically alternating (e.g., in the Y-direction) with the insulative structures 104. The insulative structures 104 and sacrificial structures 106 may define tiers 107 of the preliminary stack structure 102 each individually including at least one of the insulative structures 104 and at least one of the sacrificial structures 106.

The sacrificial structures 106 of the preliminary stack structure 102 may be formed of and include at least one material (e.g., at least one insulative material) that may be selectively removed relative to additional material (e.g., at least one additional insulative material) of the insulative structures 104. A material composition of the sacrificial structures 106 is different than a material composition of the insulative structures 104. The sacrificial structures 106 may be selectively etchable relative to the insulative structures 104 during common (e.g., collective, mutual) exposure to a first etchant, and the insulative structures 104 may be selectively etchable relative to the sacrificial structures 106 during common exposure to a second, different etchant. As used herein, a material is "selectively etchable" relative to another material if the material exhibits an etch rate that is at least about three times (3×) greater than the etch rate of another material, such as about five times (5×) greater, such as about ten times (10×) greater, about twenty times (20×) greater, or about forty times (40×) greater. As a non-limiting example, the sacrificial structures 106 be formed of and include insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the sacrificial structures 106 is formed of and includes a dielectric nitride material, such as $SiN_y$ (e.g., $Si_3N_4$). Each of the sacrificial structures 106 may individually be substantially homogeneous or substantially heterogeneous.

The insulative structures 104 of the preliminary stack structure 102 may be formed of and include at least one insulative material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, each of the insulative structures 104 is formed of and includes a dielectric oxide material, such as $SiO_x$ (e.g., $SiO_2$). Each of the insulative structures 104 may individually be substantially homogeneous, may be or a substantially heterogeneous.

Still referring to FIG. 1A, the preliminary stack structure 102 may include a staircase region 101 including at least one staircase structure 108 having steps 110 defined by edges (e.g., horizontal ends) of at least some of the tiers 107. The steps 110 may be employed as contact regions for subsequently formed conductive structures, as described in further detail below.

Figure 1B:
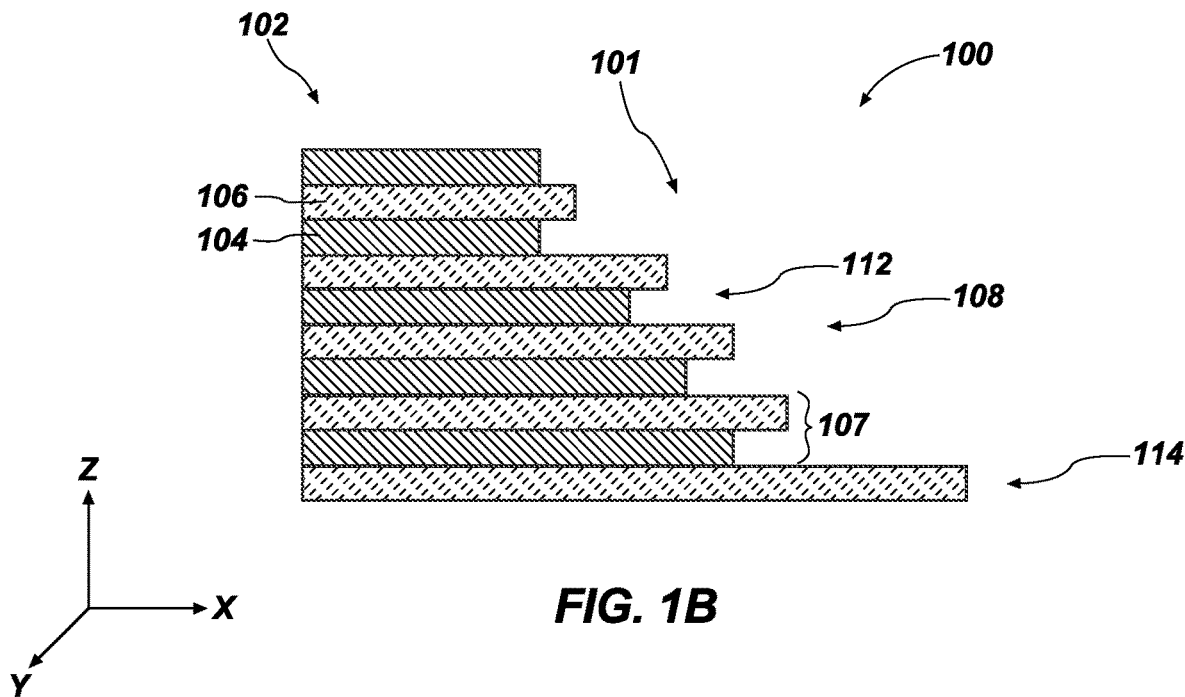

Referring next to FIG. 1B, after the preliminary stack structure 102 is formed, portions of the insulative structures 104 of at least some of the tiers 107 may be removed (e.g., etched back) to form recesses 112. The material removal process may be a selective process, such that portions of insulative material (e.g., $SiO_2$, doped $SiO_2$) of the insulative structures 104 are removed without substantially removing sacrificial material (e.g., $Si_3N_4$) of the sacrificial structures 106.

A horizontal dimension (e.g., in the X-direction) of the recesses 112 may be controlled through a duration of the material removal process. For example, a greater the duration of the material removal process a greater the horizontal dimension of the recesses 112 may be. The recesses 112 may individually inwardly extend a horizontal distance, from the lateral edge 114 of the sacrificial structure 106 of the tier 107 associated therewith, of from about 5 nanometers (nm) to about 30 nm, such as from about 10 nm to about 20 nm.

Figure 1C:
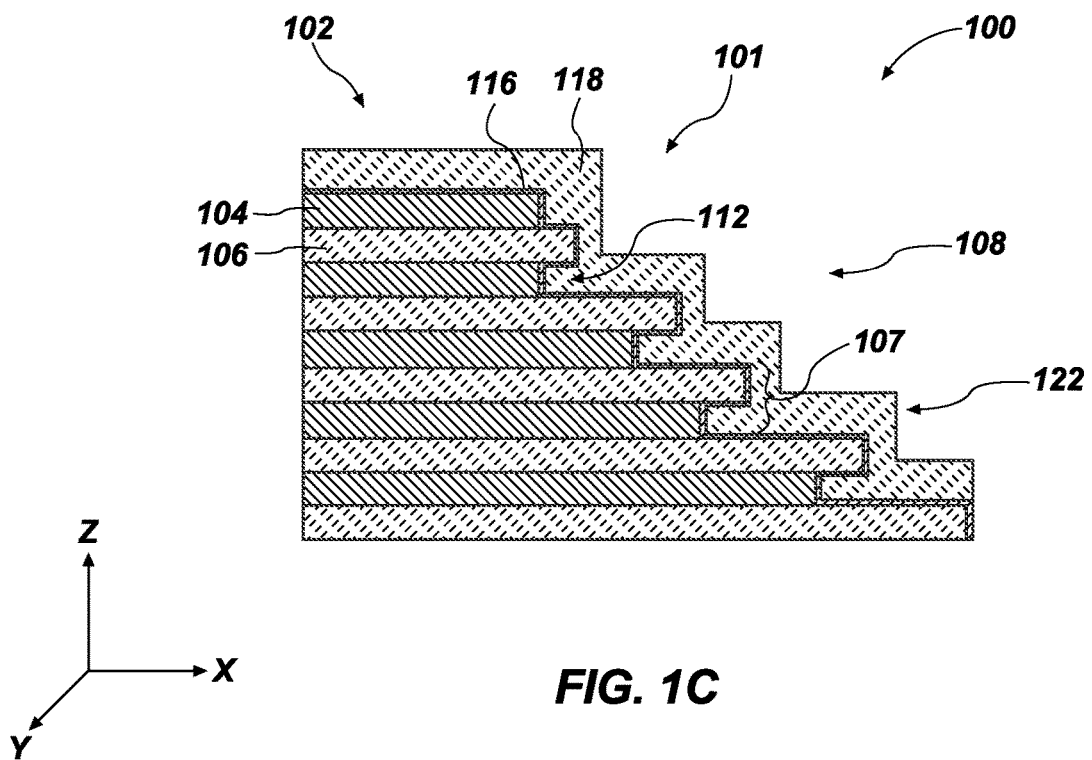

Referring next to FIG. 1C, after forming the recesses 112, an etch stop film 116 may be continuously formed (e.g., conformally deposited) over exposed surfaces of remaining portions of the insulative structures 104 and sacrificial structures 106 of the preliminary stack structure 102. The etch stop film 116 may follow the topography defined, in part, by the recesses 112. The etch stop film 116 may extend into and partially fill the recesses 112, so as to cover along top and bottom surfaces of the sacrificial structures 106 and lateral side surfaces of the insulative structures 104 defining the recesses 112. The etch stop film 116 may be formed of and include an insulative material having a lower etch rate than at least one of the sacrificial material of the sacrificial structures 106 and the insulative material of the insulative structures 104. For example, the etch stop film 116 may be formed of and include one or more of a high-k dielectric (e.g., hafnium oxide (HfO$_x$), niobium oxide (NbO$_x$), titanium oxide (TiO$_x$), aluminum oxide (AlO$_x$)), a nitride material (e.g., Si$_3$N$_4$) an oxide material (e.g., SiO$_x$), or an oxynitride material (e.g., SiO$_x$N$_x$).

The etch stop film 116 may have a thickness within a range of from about 1 nm to about 5 nm, such as within a range of from about 1 nm to about 3 nm. The etch stop film 116 may be configured to substantially prevent an etching process, such as that used in so-called "replacement gate" processing described below, from etching past an upper surface of the etch stop film 116.

Still referring to 1C, after the etch stop film 116 is formed an additional insulative structure 118 may be formed on or over the etch stop film 116. In some embodiments, the additional insulative structure 118 substantially covers the etch stop film 116, and includes a lower boundary at least partially conforming to a topography of the upper boundary (e.g., upper surface) of the etch stop film 116. The additional insulative structure 118 may extend into and at least partial fill portions of the recesses 112 remaining unfilled by the etch stop film 116. The additional insulative structure 118 may have a thickness such that the portions of the additional insulative structure 118 outside of boundaries of the recesses 112 extend beyond the lateral edges 114 of the sacrificial structures 106.

In some embodiments, the additional insulative structure 118 is formed by conformally depositing an insulative material on or over the etch stop film 116. Thereafter, exposed surfaces of the insulative material may be subjected to at least one planarization process (e.g., chemical mechanical planarization (CMP)) to form the additional insulative structure 118. As shown in FIG. 1C, the additional insulative structure 118 may exhibit a substantially planar outer lateral surface 122 substantially free from the contours of the etch stop film 116. The additional insulative structure 118 may also exhibit additional, substantially planar surfaces extending perpendicular to the substantially planar outer lateral surface 122. After the planarization process the portions of the additional insulative structure 118 corresponding to the sacrificial structures 106 (e.g., not aligned with the recesses 112) may have a thickness from about 1 nm to about 10 nm, such as from about 1 nm to about 5 nm. The portions of the additional insulative structure 118 corresponding to the recesses 112 (e.g., aligned with the recesses 112) may have a thickness that is greater than the thickness of the insulative structure 118 corresponding to the sacrificial structures 106.

The additional insulative structure 118 may be formed of and include insulative material, such as an insulative material similar to (e.g., the same as, having a similar etch rate as) that of the sacrificial structures 106. In some embodiments, the additional insulative structure 118 is formed of and includes a dielectric nitride material, such as SiN$_y$ (e.g., Si$_3$N$_4$).

Figure 1D:
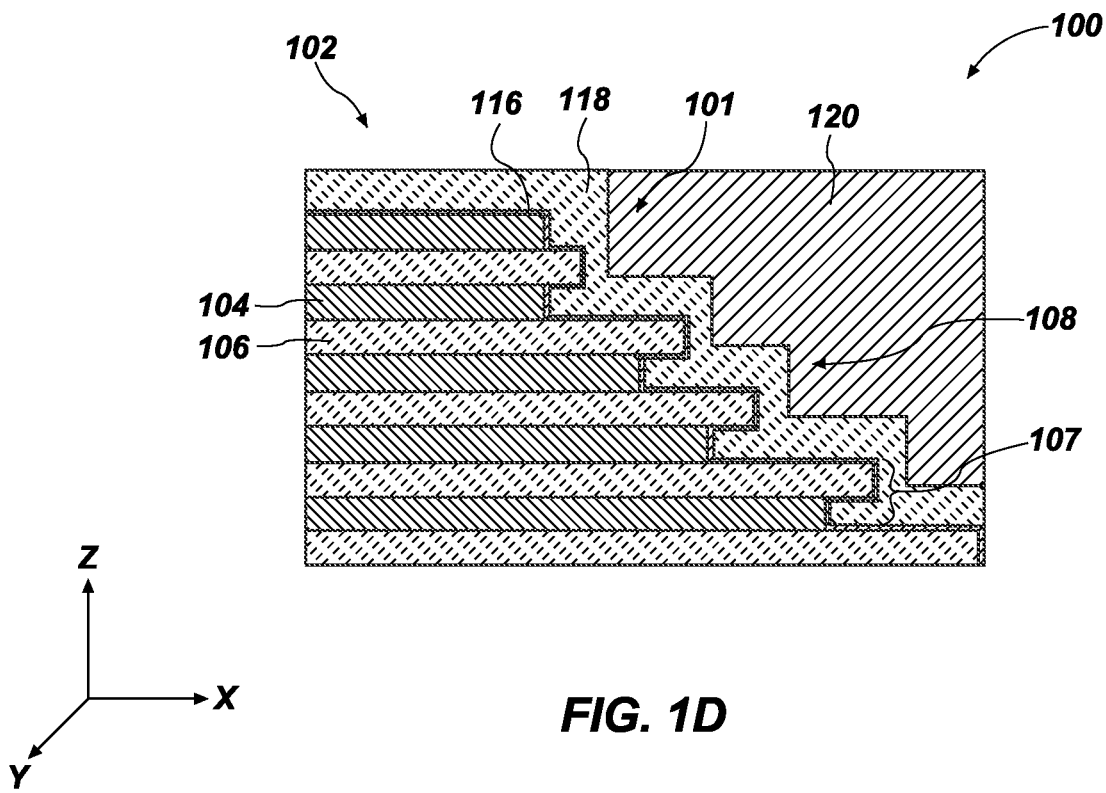

Referring next to FIG. 1D, after the etch stop film 116 and the additional insulative structure 118 are formed, an insulative fill material 120 may be formed on or over the additional insulative structure 118. The insulative fill material 120 may substantially fill trenches overlying and at least partially defining the staircase structures 108 within the staircase region 101. The combination of the additional insulative structure 118 and the insulative fill material 120 may be configured to provide structural support to the preliminary stack structure 102 when sacrificial material of the sacrificial structures 106 is subsequently removed, as described in further detail below.

The insulative fill material 120 may be formed of and include insulative material, such as insulative material similar to (e.g., the same as, having a similar etch rate as) that of the insulative structures 104. In some embodiments, the insulative fill material 120 is formed of and includes a dielectric oxide material, such as SiO$_x$ (e.g., SiO$_2$).

Figure 1E:
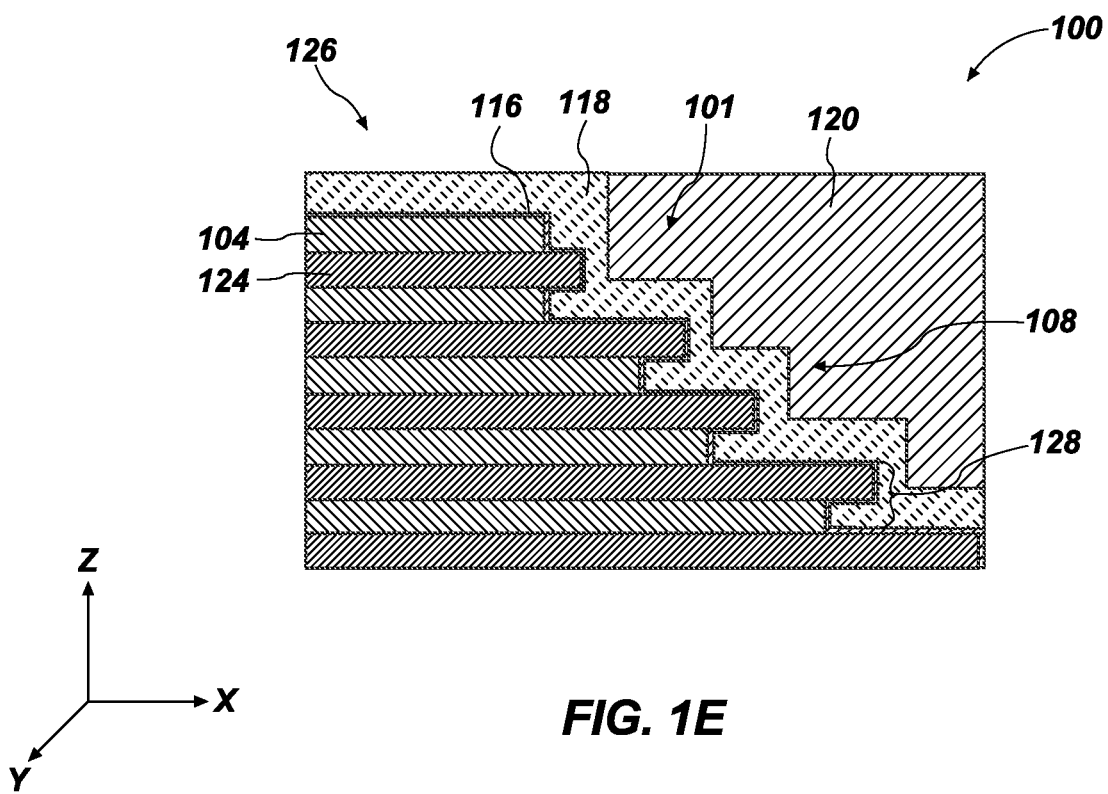

Referring next to FIG. 1E, after the additional insulative structure 118 and the insulative fill material 120 are formed, a replacement gate process may be effectuated on the preliminary stack structure 102 (FIG. 1D) to at least partially (e.g., substantially) replace the sacrificial structures 106 (FIG. 1D) with conductive structures 124 and form a stack structure 126. The stack structure 126 may include tiers 128 of the conductive structures 124 and remaining portions of the insulative structures 104. An etchant employed in the replacement gate process may selectively remove the sacrificial structures 106 (FIG. 1D) relative to the insulative structures 104, the etch stop film 116, the additional insulative structure 118, and the insulative fill material 120. The etch stop film 116 may be configured to substantially prevent removal of the insulative structure 118.

After the sacrificial structures 106 (FIG. 1D) are selectively removed but prior to the formation of the conductive structures 124 voids may be formed between remaining portions of the insulative structures 104. The additional insulative structure 118 and the insulative fill material 120 may support the insulative structures 104, such that the voids retain substantially the same shape as the sacrificial structures 106 (FIG. 1D) that were removed. The voids may then be filled with conductive material to form the conductive structures 124. The conductive structures 124 may comprise, for example, one or more of at least one metal, at least one metal alloy, at least one conductive metal oxide, at least one conductive metal nitride, at least one conductive metal silicide, and at least one conductively-doped semiconductor material. By way of non-limiting example, the conductive structures 124 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN$_x$), titanium silicide (TiSi$_y$), titanium silicon nitride (TiSi$_x$N$_y$), titanium aluminum nitride (TiAl$_x$N$_y$), molybdenum nitride (MoN$_x$), iridium (Ir), iridium oxide (IrO$_x$), ruthenium (Ru), ruthenium oxide (RuO$_x$), and conductively-doped silicon. In some embodiments, the conductive structures 124 are formed of and include W. In some embodiments, the conductive structures 124 are formed of and include TiN$_x$.

Figure 1F:
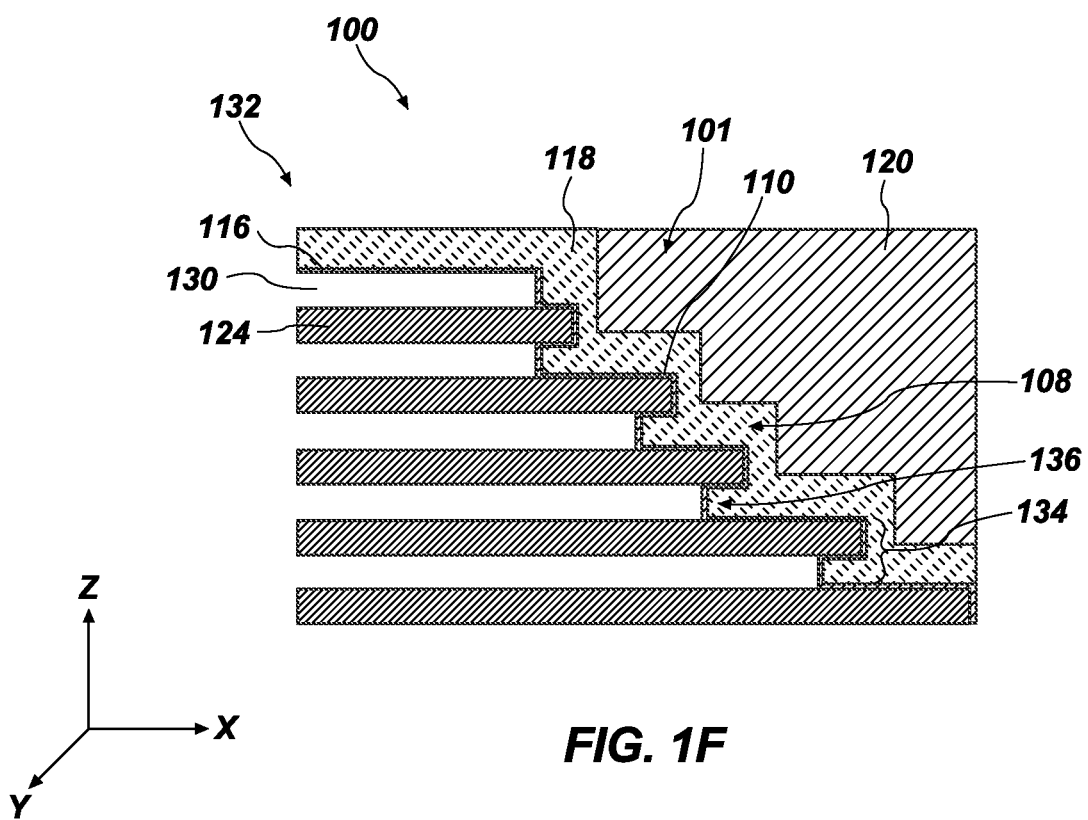

Referring next to FIG. 1F, the insulative structures 104 (FIG. 1E) of the stack structure 126 (FIG. 1E) may be at least partially removed to form air gaps 130 interposed between and separating the conductive structures 124. The removal of the insulative structures 104 (FIG. 1E) may form a modified stack structure 132 including tiers 134 of the conductive structures 124 and the air gaps 130. Each tier 134 of the modified stack structure 132 may include a conductive structure 124 and an air gap 130 vertically neighboring the conductive structure 124. The air gaps 130, which may have a higher dielectric constant than the insulative structures 104 (FIG. 1E), may facilitate enhanced inhibition of capacitive coupling between the conductive structures 124 as compared to the insulative structures 104 (FIG. 1E).

The insulative structures 104 (FIG. 1E) may be removed through an etching process, such as wet etching using a chemical etchant formulated to selectively remove the insulative structures 104 relative to the conductive structures 124 and the etch stop film 116. The etch stop film 116 may substantially prevent removal of the additional insulative structure 118 and the insulative fill material 120 during the formation of the air gaps 130. By substantially preventing removal of the additional insulative structure 118 and the insulative fill material 120, the etch stop film 116 may facilitate maintained support of the conductive structures 124 by way of the additional insulative structure 118 and the insulative fill material 120 to substantially prevent collapse of the conductive structures 124 during and/or after the formation of the air gaps 130.

As described above, the additional insulative structure 118 may extend into the recesses 112 (FIG. 1B) formed at the process stage previously described with reference to FIG. 1B. Portion (e.g., horizontal projections) of the additional insulative structure 118 extending into recesses 112 (FIG. 1B) may provide support at horizontal ends of the conductive structures 124 and maintain a separation between the conductive structures 124. Furthermore, the portions of the additional insulative structure 118 extending into the recesses 112 (FIG. 1B) may form buffer regions, such that if the etching process utilized to form the air gaps 130 breaks through the etch stop film 116, the additional insulative structure 118 creates a second barrier to substantially prevent the etchant from eroding additional portions of the insulative structure 118 and the insulative fill material 120 providing structural stability to the horizontal ends of the conductive structures 124.

Figure 2A:
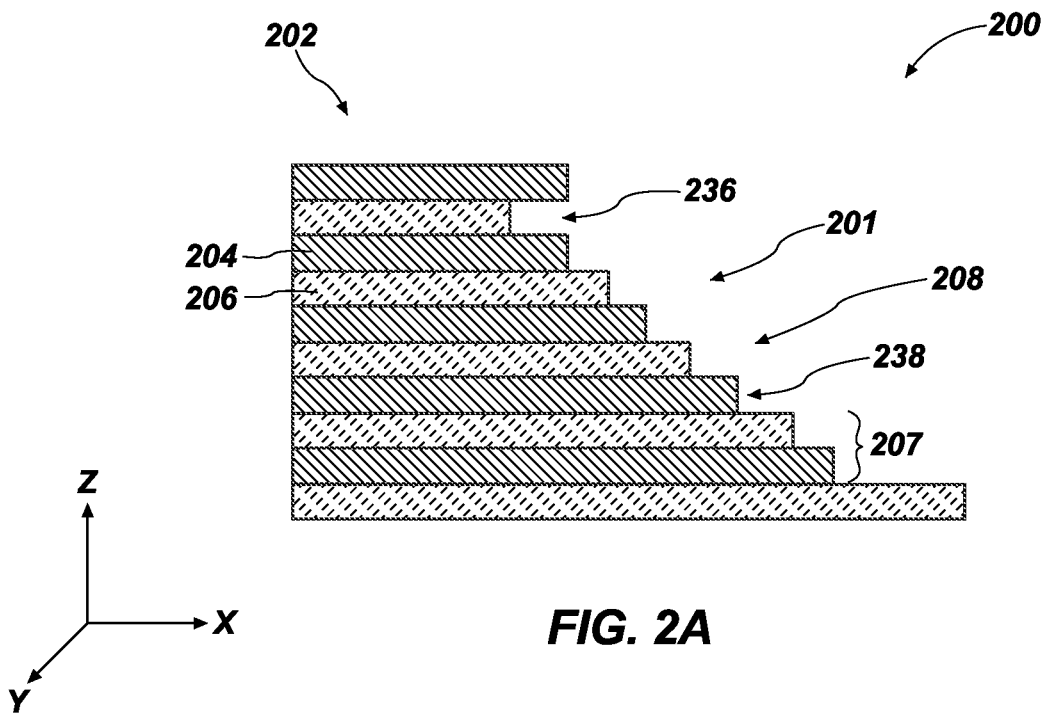
FIG. 2A through FIG. 2C illustrate simplified, partial side cross-sectional views of a microelectronic device structure at different processing stages of a method of forming a microelectronic device, in accordance with additional embodiments of the disclosure.
Figure 2B:
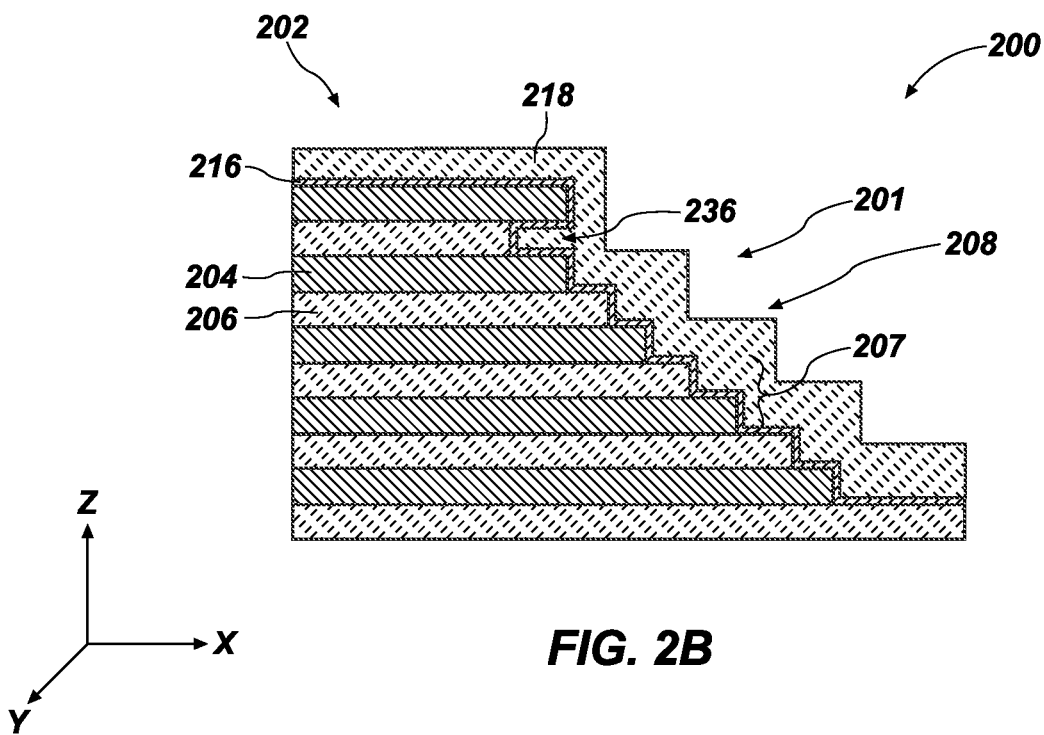
Figure 2C:
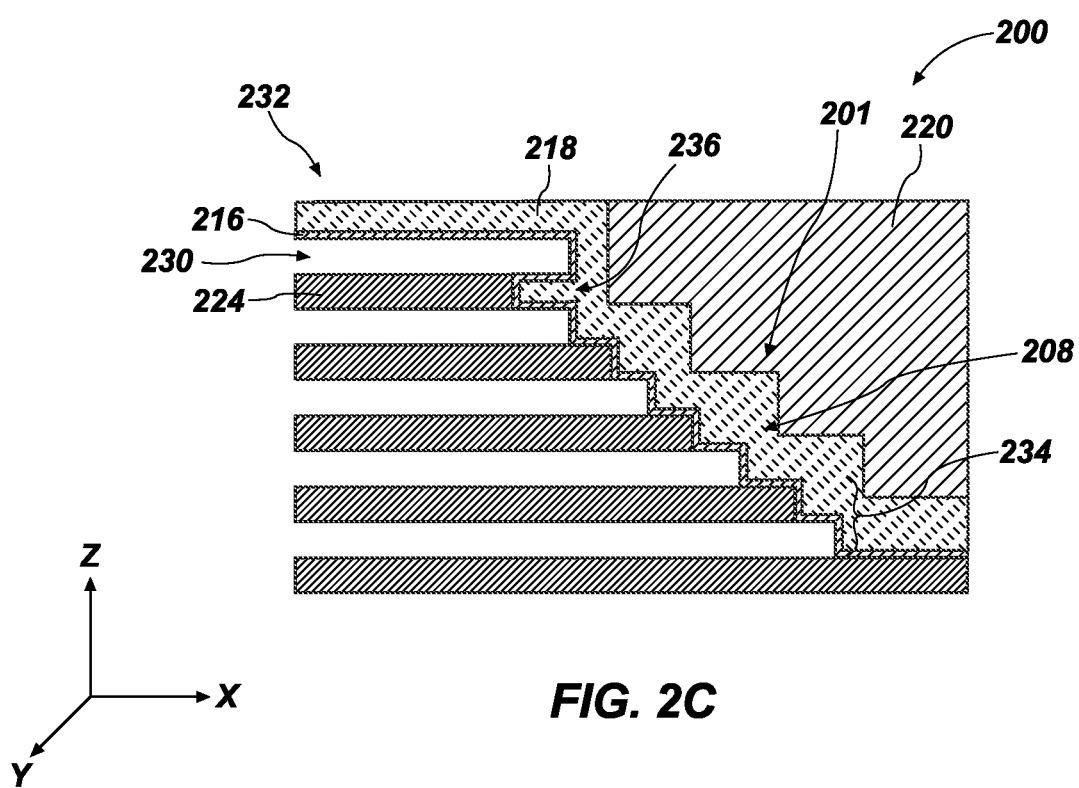

FIGS. 2A through 2C are simplified, partial side cross-sectional views of a microelectronic device structure 200 at different processing stages of an additional method of forming a microelectronic device (e.g., a memory device, such as a 3D NAND Flash memory device), in accordance with additional embodiments of the disclosure. Throughout FIGS. 2A through 2C and the associated description below, features (e.g., structures, materials, regions, devices) functionally similar to features previously described with reference to one or more of FIGS. 1A through 1F are referred to with similar reference numerals incremented by 100. To avoid repetition, not all features shown in one or more of FIGS. 2A through 2C are described in detail herein. Rather, unless described otherwise below, in FIGS. 2A through 2C, a feature designated by a reference numeral that is a 100 increment of the reference numeral of a feature previously described with reference to one or more of FIGS. 1A through 1F will be understood to be substantially similar to the previously described feature.

Referring to FIG. 2A, a preliminary stack structure 202 having a vertically alternating sequence of insulative structures 204 and sacrificial structures 206 arranged in tiers 207 may be subjected to a material removal process to selectively remove portions of the sacrificial structures 206 and form recesses 236 horizontally neighboring remaining portions of the sacrificial structures 206. For example, one or more portions of an individual sacrificial structure 206 may be selectively removed, such as through dry etching or wet etching, such that lateral edges (e.g., horizontal ends) of remaining portions of the sacrificial structure 206 are horizontally offset from lateral edges 238 of the insulative structures 204 The material removal process may employ one or more etchants formulated to etch the sacrificial structures 206 at a higher rate than the insulative structures 204.

A horizontal dimension (e.g., in the X-direction) of the recesses 236 may be controlled through a duration of the material removal process. For example, a greater the duration of the material removal process a greater the horizontal dimension of the recesses 236 may be. The recesses 236 may individually inwardly extend a horizontal distance, from the lateral edge 238 of the insulative structure 204 of the tier 207 associated therewith, of from about 5 nanometers (nm) to about 30 nm, such as from about 10 nm to about 20 nm.

After forming the recesses 236, an etch stop film 216 may be continuously formed (e.g., conformally deposited) over exposed surfaces of remaining portions of the insulative structures 204 and sacrificial structures 206 of the preliminary stack structure 202. The etch stop film 216 may follow the topography defined, in part, by the recesses 236. The etch stop film 216 may extend into and partially fill the recesses 236, so as to cover along top and bottom surfaces of the insulative structures 204 and lateral side surfaces of the sacrificial structures 206 defining the recesses 236. The etch stop film 216 may be formed of and include an insulative material having a lower etch rate than at least one of the sacrificial material of the sacrificial structures 206 and the insulative material of the insulative structures 204. For example, the etch stop film 216 may be formed of and include one or more of a high-k dielectric (e.g., hafnium oxide ($HfO_x$), niobium oxide ($NbO_x$), titanium oxide ($TiO_x$), aluminum oxide ($AlO_x$)), a nitride material (e.g., $Si_3N_4$) an oxide material (e.g., $SiO_x$), or an oxynitride material (e.g., $SiO_xN_x$).

The etch stop film 216 may have a thickness within a range of from about 1 nm to about 5 nm, such as within a range of from about 1 nm to about 3 nm. The etch stop film 216 may be configured to substantially prevent an etching process, such as that used in so-called "replacement gate" processing described below, from etching past an upper surface of the etch stop film 216.

Still referring to FIG. 2B, after the etch stop film 216 is formed an additional insulative structure 218 may be formed on or over the etch stop film 216. Similar to the additional insulative structure 118 described above, the additional insulative structure 218 may substantially conform with the topography of the upper boundary (e.g., upper surface) of the etch stop film 216, which substantially conforms with the topography of the preliminary stack structure 202, which is defined, in part, by the recesses 236, as described above. Thus, the additional insulative structure 218 extends into the recesses 236 similar to the etch stop film 216. The additional insulative structure 218 may have a thickness such that the portions of the additional insulative structure 218 corresponding to the recesses 236 extend beyond the lateral edges 238 of the insulative structures 204. After the additional insulative structure 218 is formed, exposed surfaces of the insulative material may be subjected to at least one planarization process (e.g., chemical mechanical planarization (CMP)) to form the additional insulative structure 218. At and/or outside of outer horizontal boundaries of the staircase region 201, the additional insulative structure 218 may exhibit a substantially planar outer lateral surface substantially free from the contours of the etch stop film 216. The additional insulative structure 218 may also exhibit additional, substantially planar surfaces extending perpendicular to the substantially planar outer lateral surface. After the planarization process the portions of the additional insulative structure 218 corresponding to the insulative structures 204 (e.g., not aligned with the recesses 236) may have a thickness from about 1 nm to about 10 nm, such as from about 1 nm to about 5 nm. The portions of the additional insulative structure 218 corresponding to the recesses 236 (e.g., aligned with the recesses 236) may have a thickness that is greater than the thickness of the additional insulative structure 218 corresponding to the insulative structures 204.

The additional insulative structure 218 may be formed of and include an insulative material, such as an insulative material similar to (e.g., the same as, having a similar etch rate as) that of the sacrificial structures 206. In some embodiments, the additional insulative structure 218 is formed of and includes a dielectric nitride material, such as $SiN_y$ (e.g., $Si_3N_4$).

After the additional insulative structure 218 is formed, an insulative fill material 220, similar to the insulative fill material 120 described above with reference to FIG. 1D, is formed on or over the additional insulative structure 218.

Referring next to FIG. 2C, after the additional insulative structure 218 and the insulative fill material 220 are formed, a replacement gate process may be effectuated on the preliminary stack structure 202 (FIG. 2B) to replace the sacrificial structures 206 (FIG. 2B) with conductive structures 224, and then the insulative structures 204 may be removed to form air gaps 230 interposed between and separating the conductive structures 224. The removal of the insulative structures 204 (FIG. 2B) may form a modified stack structure 232 including tiers 234 of the conductive structures 224 and the air gaps 230. Each tier 234 of the modified stack structure 232 may include a conductive structure 224 and an air gap 230 vertically neighboring the conductive structure 224. The air gaps 230, which may have a higher dielectric constant than the insulative structures 204 (FIG. 2B), may facilitate enhanced inhibition of capacitive coupling between the conductive structures 224 as compared to the insulative structures 204 (FIG. 2B).

Embodiments of the disclosure include a microelectronic device. The microelectronic device includes a stack structure including a vertically alternating sequence of conductive structures and air gaps arranged in tiers. Each of the tiers including one of the conductive structures vertically neighboring one of the air gaps. The microelectronic device further includes a staircase structure within the stack structure. The staircase structure having steps including horizontal ends of at least some of the tiers of the stack structure. The microelectronic device also includes insulative material formed over the stack structure and the staircase structure, portions of the insulative material within vertical boundaries of the air gaps and inwardly horizontally projecting past outer horizontal boundaries of the conductive structures.

FIG. 3A through FIG. 3E are simplified, partial side cross-sectional views of a microelectronic device structure 300 at different processing stages of an additional method of forming a microelectronic device (e.g., a memory device, such as a 3D NAND Flash memory device), in accordance with additional embodiments of the disclosure. Throughout FIGS. 3A through 3E and the associated description below, features (e.g., structures, materials, regions, devices) functionally similar to features previously described with reference to one or more of FIGS. 1A through 1F and FIGS. 2A through 2C are referred to with similar reference numerals incremented by 100. To avoid repetition, not all features shown in one or more of FIGS. 3A through 3E are described in detail herein. Rather, unless described otherwise below, in FIGS. 3A through 3E, a feature designated by a reference numeral that is a 100 increment of the reference numeral of a feature previously described with reference to one or more of FIGS. 1A through IF and FIGS. 2A through 2C will be understood to be substantially similar to the previously described feature.

Figure 3A:
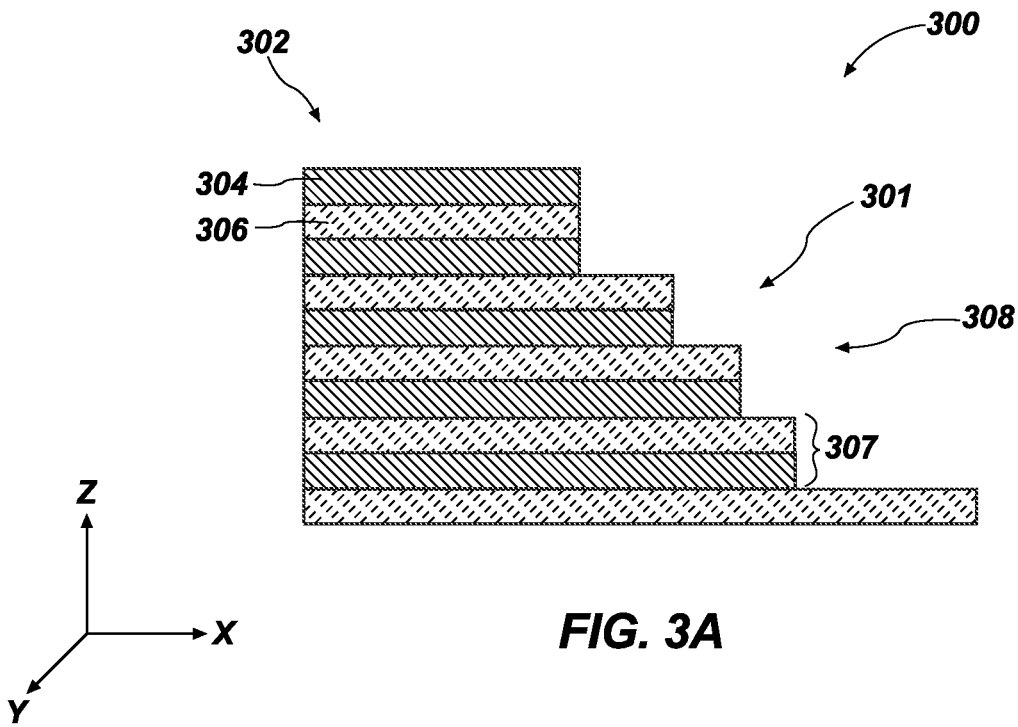
FIG. 3A through FIG. 3E illustrate simplified, partial side cross-sectional views of a microelectronic device structure at different processing stages of a method of forming a microelectronic device, in accordance with further embodiments of the disclosure.

Referring to FIG. 3A, a preliminary stack structure 302 is formed to include a vertically alternating sequence of insulative structures 304 and sacrificial structures 306 arranged in tiers 307. The preliminary stack structure 302 further include a staircase region 301 including at least one staircase structure 308 having steps 310 defined by edges (e.g., horizontal ends) of at least some of the tiers 307.

Figure 3B:
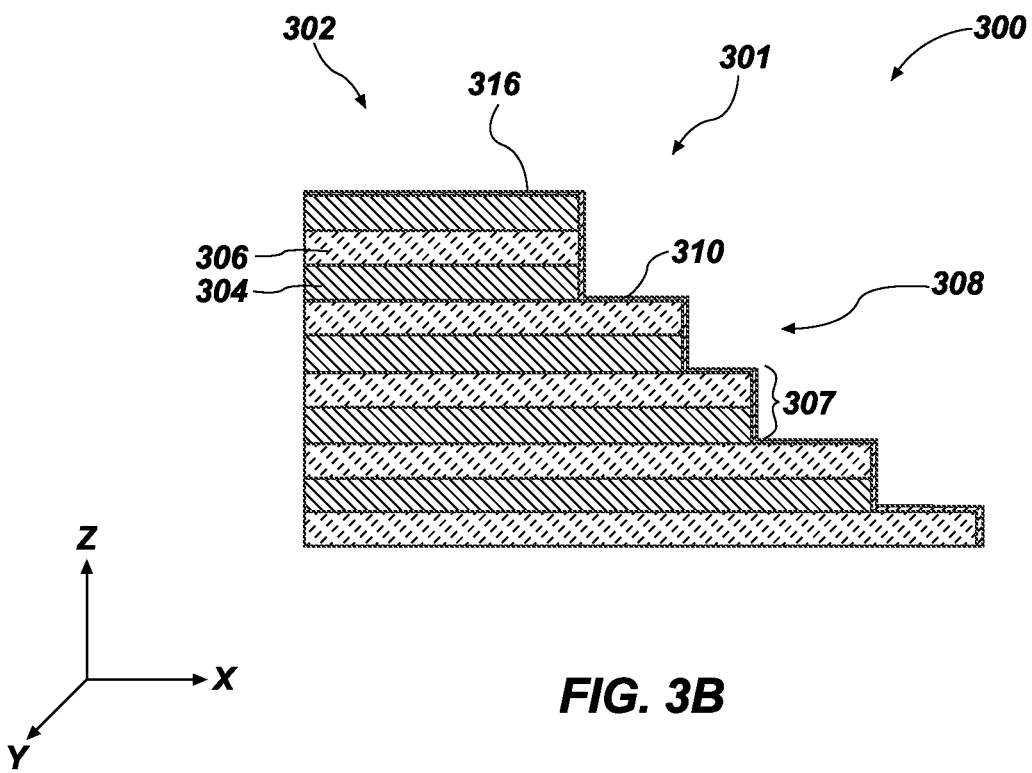

Referring next to FIG. 3B, an etch stop film 316 may be continuously formed (e.g., conformally deposited) over the preliminary stack structure 302. The etch stop film 316 may be formed without previously horizontally recessing one of the insulative structures 304 and the sacrificial structures 306 relative to the other of the insulative structures 304 and sacrificial structures 306. Accordingly, for an individual tier 307 of the preliminary stack structure 302, the lateral edges of the insulative structure 304 and the sacrificial structure 306 thereof may be substantially coplanar with one another prior to the formation of the etch stop film 316.

The etch stop film 316 is formed from an insulative material having a lower etch rate than at least one of the sacrificial material of the sacrificial structures 306 and the insulative material of the insulative structures 304. For example, the etch stop film 316 may be formed from one or more of a high-k dielectric (e.g., hafnium oxide ($HfO_x$), niobium oxide ($NbO_x$), titanium oxide ($TiO_x$), aluminum oxide), an oxide material (e.g., $SiO_x$), or an oxynitride material (e.g., $SiO_xN_x$).

The etch stop film 316 may have a thickness within a range from about 1 nm to about 10 nm, such as from about 1 nm to about 5 nm, or from about 1 nm to about 3 nm. The etch stop film 316 may be configured to substantially prevent an etching process, such as that used in replacement gate processing, from etching past an upper surface of the etch stop film 316.

Figure 3C:
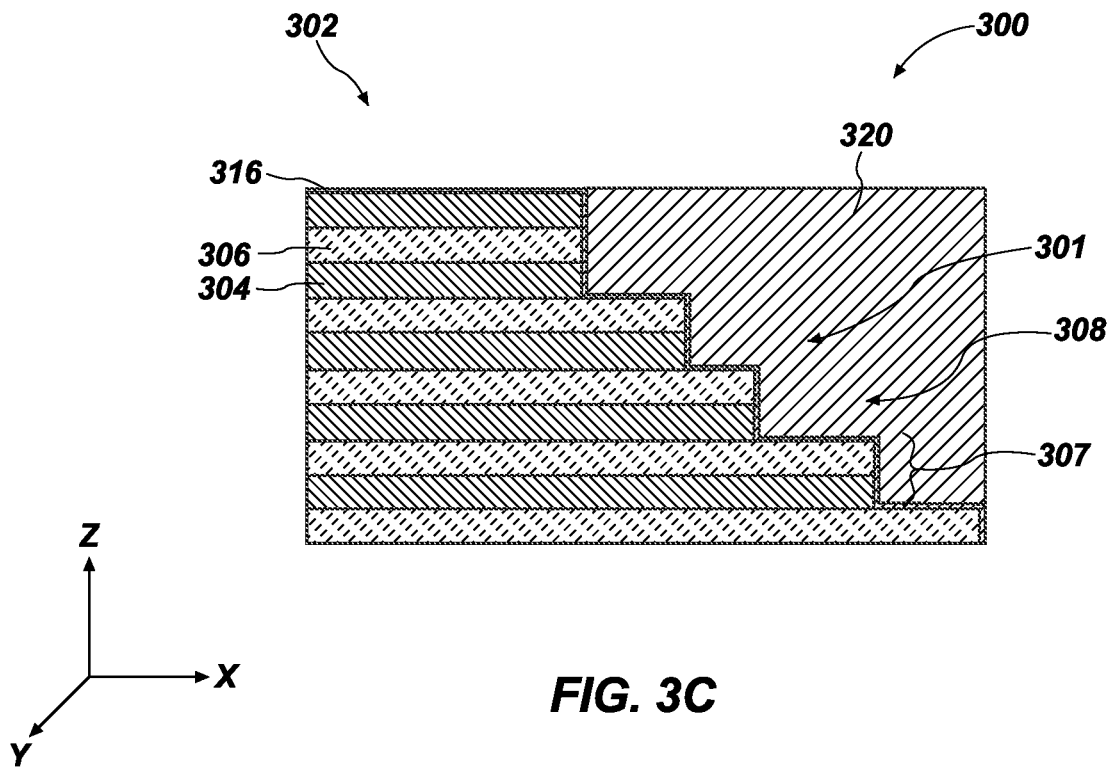

Referring next to FIG. 3C, after the etch stop film 316 is formed, an insulative fill material 320 is formed on or over the etch stop film 316. The insulative fill material 320 may be configured to provide structural support to the preliminary stack structure 302 when material is removed, such as during the replacement gate process or other material removal. The insulative fill material 320 may be formed from an insulative material similar to the insulative structures 304, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative fill material 320 is formed of and includes a dielectric oxide material, such as $SiO_x$ (e.g., $SiO_2$).

Figure 3D:
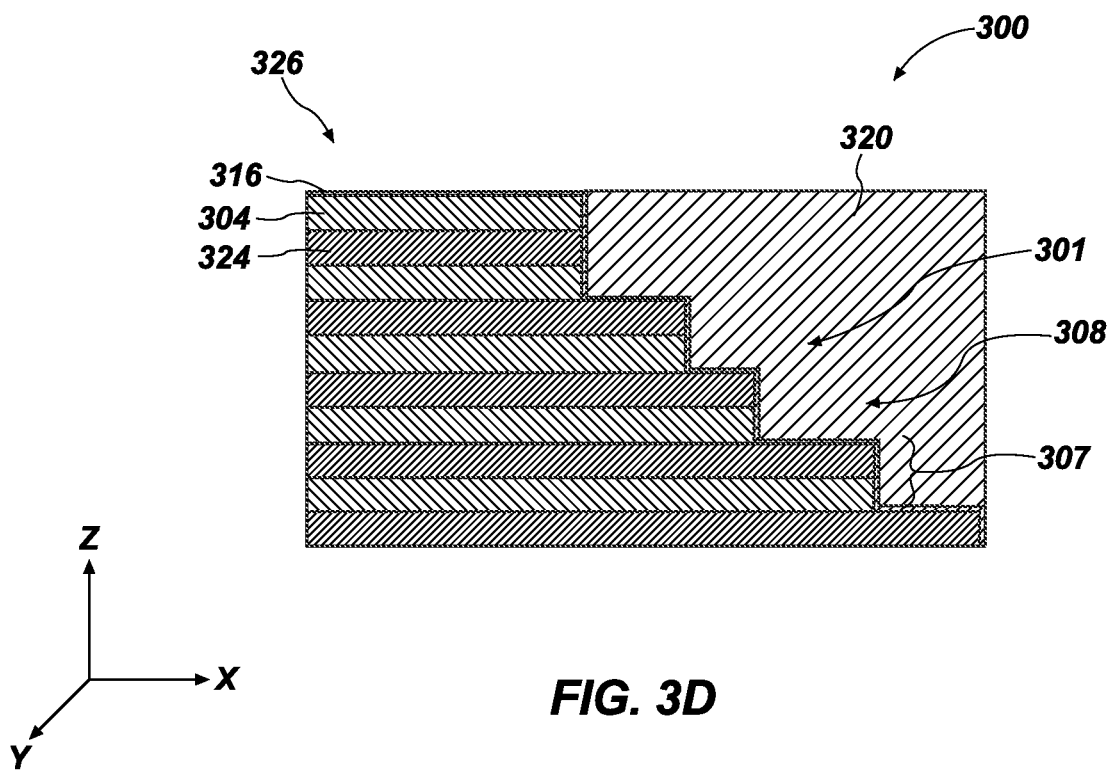

Referring to FIG. 3D, after the insulative fill material 320 is formed on or over the etch stop film 316, a replacement gate process may be effectuated on the preliminary stack structure 302 to replace the sacrificial structures 306 (FIG. 3C) with conductive structures 324 and form a stack structure 326. During the replacement gate process, the etch stop film 316 may substantially prevent removal of the insulative fill material 320.

Figure 3E:
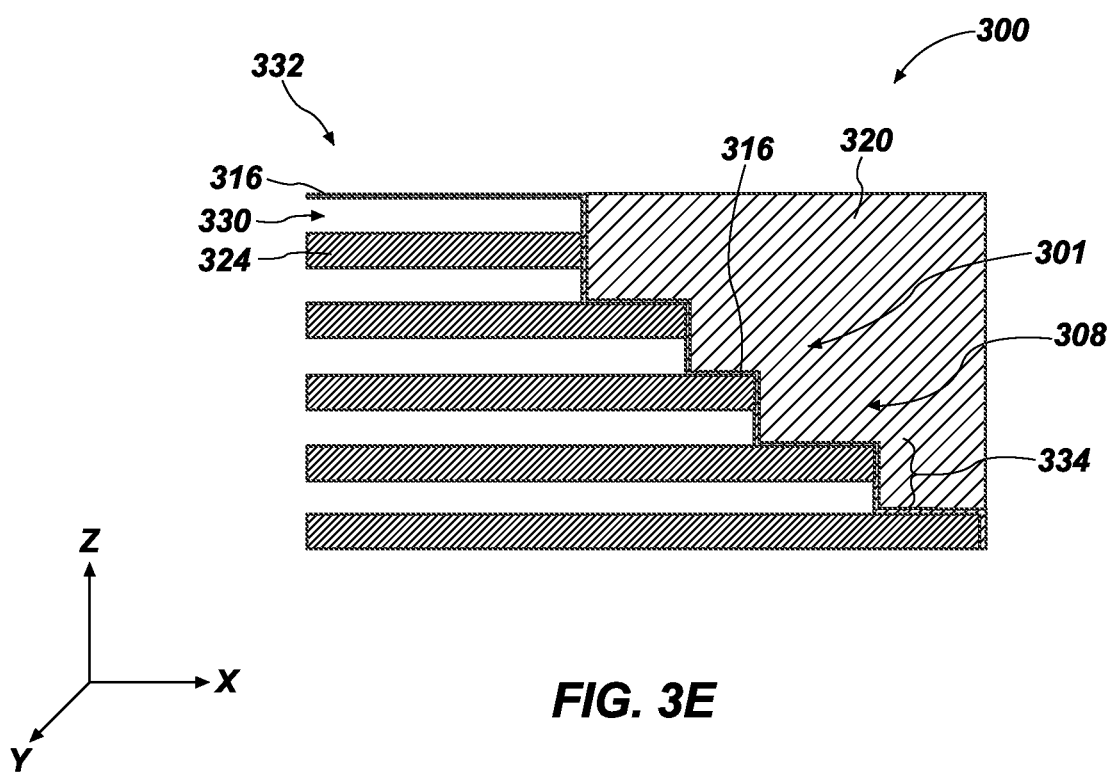

Referring next to FIG. 3E, the insulative structures 304 may be selectively removed relative to the conductive structures 324 to form a modified stack structure 332 including tiers 334 of the conductive structures 324 and the air gaps 330. Each tier 334 of the modified stack structure 332 may include a conductive structure 324 and an air gap 330 vertically neighboring the conductive structure 324. The air gaps 330, which may have a higher dielectric constant than the insulative structures 304 (FIG. 3D), may facilitate enhanced inhibition of capacitive coupling between the conductive structures 324 as compared to the insulative structures 304 (FIG. 3D).

Embodiments of the disclosure include a microelectronic device. The microelectronic device includes a stack structure. The stack structure includes conductive structures; and air gaps vertically alternating with the conductive structures. The stack structure further includes a staircase structure within the stack structure. The staircase structure has steps comprising edges of at least some of the conductive structures of the stack structure. The microelectronic device further includes an etch stop material continuously extending over the conductive structures and at least partially defining horizontal boundaries of the air gaps. The microelectronic device also includes insulative material over the etch stop material.

Embodiments of the disclosure include a method of forming a microelectronic device. The method includes forming a preliminary stack structure comprising insulative structures and sacrificial structures vertically alternating with the insulative structures. The method further includes conformally depositing an etch stop material over exposed surfaces of the insulative structures and sacrificial structures. The method also includes forming insulative material over exposed surfaces of the etch stop material, the insulative material having a different material composition than the etch stop material. The method further includes replacing the sacrificial structures with conductive structures after forming the insulative material. The method also includes at least partially removing the insulative structures, after replacing the sacrificial structures with conductive structures, to form a stack structure comprising air gaps vertically alternating with the conductive structures.

Figure 4:
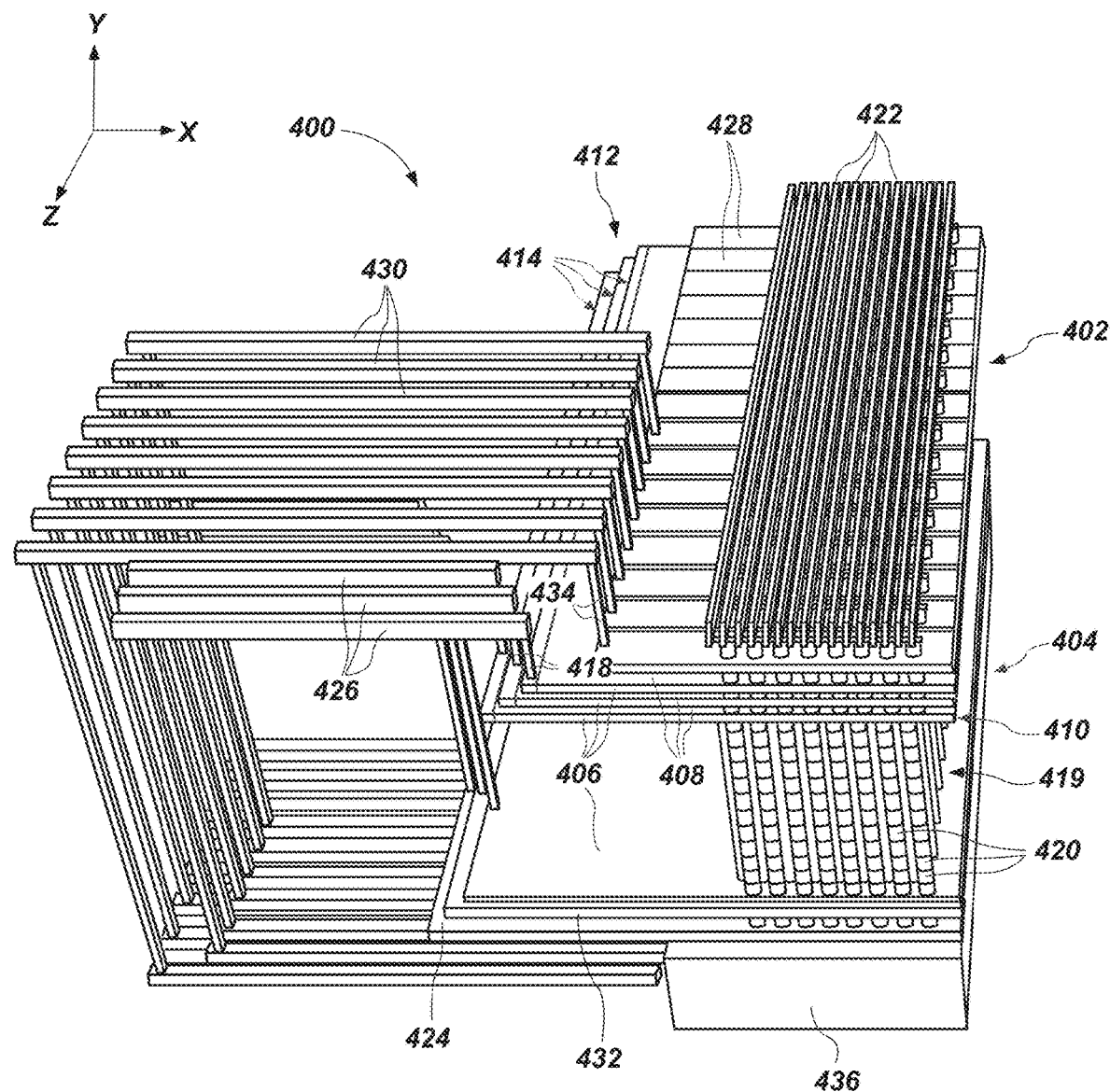
FIG. 4 is a partial, cutaway perspective view of a microelectronic device, in accordance with embodiments of the disclosure.

Microelectronic device structures (e.g., the microelectronic device structures 100, 200, 300 previously described with reference to FIGS. 1F, 2C, and 3E) of the disclosure may be included in microelectronic devices of the disclosure. For example, FIG. 4 illustrates a partial cutaway perspective view of a microelectronic device 400 (e.g., a memory device, such as a 3D NAND Flash memory device) including a microelectronic device structure 402. The microelectronic device structure 402 may be substantially similar to one of the microelectronic device structures 100, 200, 300 at one of the processing stages previously described with reference to FIGS. 1F, 2C, and 3E, respectively. In some embodiments, the microelectronic device structure 402 is formed through a method previously described herein with reference to FIGS. 1A through 1F, FIGS. 2A through 2C, or FIGS. 3A through 3E.

As shown in FIG. 4, the microelectronic device 400 may include a stack structure 404 including a vertically alternating (e.g., in the Z-direction) sequence of conductive structures 406 and air gaps 408 arranged in tiers 410; a staircase structure 412 having steps 414 defined by edges (e.g., horizontal ends in the X-direction) of the tiers 410; and contact structures 418 extending to and contacting (e.g., physically contacting, electrically contacting) to the conductive structures 406 of the tiers 410 of the stack structure 404 at the steps 414 of the staircase structure 412. The stack structure 404, the conductive structures 406, and the air gaps 408 may respectively be substantially similar to the modified stack structures 132, 232, or 332; the conductive structures 124, 224, or 324; and the air gaps 130, 230, or 330 previously described herein. The microelectronic device 400 also includes additional features (e.g., structures, devices), as described in further detail below.

The microelectronic device 400 may further include vertical strings 419 of memory cells 420 coupled to each other in series, digit line structures 422 (e.g., data line structures, bit line structures), at least one source structure 424, access line routing structures 426, first select gates 428 (e.g., upper select gates, drain select gates (SGDs)), select line routing structures 430, second select gates 432 (e.g., lower select gates, source select gates (SGSs)), and additional contact structures 434. The vertical strings 419 of memory cells 420 extend orthogonal to conductive lines and tiers (e.g., the digit line structures 422, the source structure 424, the tiers 410 of the stack structure 404, the access line routing structures 426, the first select gates 428, the select line routing structures 430, the second select gates 432). In some embodiments, the memory cells 420 comprise so-called "MONOS" (metal-oxide-nitride-oxide-semiconductor) memory cells. In additional embodiments, the memory cells 420 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 420 comprise so-called "floating gate" memory cells. The conductive contact structures 418 and the additional contact structures 434 may electrically couple components to each other as shown (e.g., the select line routing structures 430 to the first select gates 428, the access line routing structures 426 to the tiers 410 of the stack structure 404 of the microelectronic device structure 402).

The microelectronic device 400 may also include a base structure 436 positioned vertically below the vertical strings 419 of memory cells 420. The base structure 436 may include at least one control logic region including control logic devices configured to control various operations of other features (e.g., the vertical strings 419 of memory cells 420) of the microelectronic device 400. As a non-limiting example, the control logic region of the base structure 436 may further include one or more (e.g., each) of charge pumps (e.g., VCCP charge pumps, VNEGWL charge pumps, DVC2 charge pumps), delay-locked loop (DLL) circuitry (e.g., ring oscillators), Vdd regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 436 may be coupled to the source structure 424, the access line routing structures 426, the select line routing structures 430, and the digit line structures 422. In some embodiments, the control logic region of the base structure 436 includes CMOS (complementary metal-oxide-semiconductor) circuitry. In such embodiments, the control logic region of the base structure 436 may be characterized as having a "CMOS under Array" ("CuA") configuration.

Figure 5:
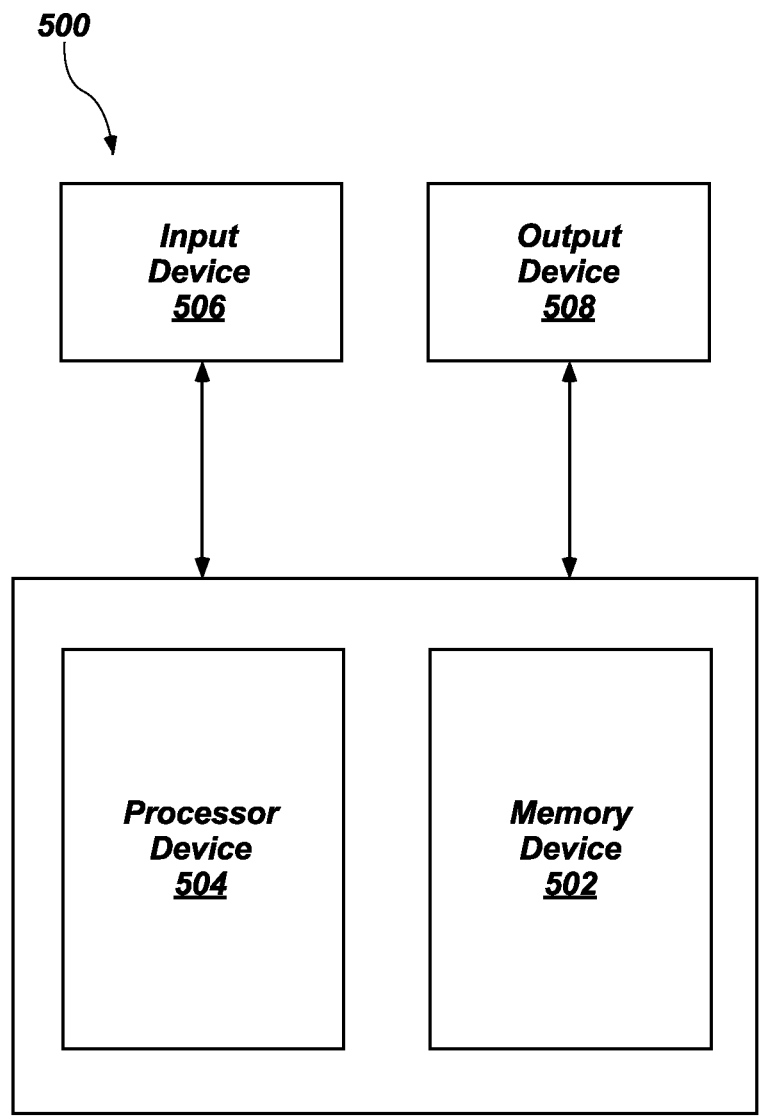
FIG. 5 illustrates an electronic system in accordance with one or more embodiments of the disclosure.

Microelectronic devices (e.g., the microelectronic device 400) of the disclosure may be included in embodiments of electronic systems of the disclosure. For example, FIG. 5 is a block diagram of an electronic system 500, in accordance with embodiments of the disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 500 includes at least one memory device 502. The memory device 502 may include, for example, an embodiment of a microelectronic device previously described herein (e.g., the microelectronic device 400).

Embodiments of the disclosure may include a memory device. The memory device may include a stack structure including tiers each including a conductive structure and an air gap vertically neighboring the conductive structure. The memory device further includes a staircase structure within the stack structure and having steps including horizontal ends of the tiers of the stack structure. The memory device also includes a first dielectric material continuously extending over boundaries the stack structure and the staircase structure. The memory device further includes a second dielectric material on the first dielectric material. The memory device also includes a memory array comprising strings of memory cells vertically extending through the stack structure. The memory device further includes a source structure vertically underlying the stack structure and in electrical communication with the strings of memory cells. The memory device also includes digit line structures vertically overlying the stack structure and in electrical communication with the strings of memory cells.

The electronic system 500 may further include at least one electronic signal processor device 504 (often referred to as a "microprocessor"). The electronic signal processor device 504 may, optionally, include an embodiment of a microelectronic device (e.g., the microelectronic device 400) previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Embodiments of the disclosure may include an electronic system. The electronic system includes an input device, an output device, a processor device operably connected to the input device and the output device, and a memory device operably connected to the processor device. The memory device includes a stack structure including a vertically alternating sequence of conductive material and air gaps arranged in tiers. The stack structure includes one or more staircase structures having steps including portions of the conductive material of the tiers. The memory device further includes an etch stop material formed over the stack structure, the etch stop material substantially conforming to a topography of the one or more staircase structures. The memory device also includes insulative material over the etch stop material.

The structures, devices, and methods of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods.

The structures, devices, and methods of the disclosure may, for example, enhance one or more of a strength and a rigidity of a microelectronic device structure including a stack structure including conductive structures separated by air gaps. Increasing the strength and/or the rigidity of the microelectronic device structure may permit one or more dimensions of the microelectronic device structure to be reduced, such as by reducing vertical thicknesses of the conductive structures and/or reducing a vertical thickness of the air gaps therebetween. Reducing dimensions of the microelectronic device structure may facilitate enhanced feature density of a microelectronic device including the microelectronic device structure, as compared to conventional microelectronic devices. Enhancing a feature density of the microelectronic device, may permit the microelectronic device to be relatively smaller, which in turn may permit an electronic system including the microelectronic device to be relatively smaller than conventional electronic systems. The structures, devices, and methods of the disclosure may improve scalability, efficiency, and simplicity as compared to conventional structures, conventional devices, and conventional methods.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A microelectronic device comprising:
   a stack structure comprising:
      conductive structures; and
      air gaps vertically alternating with the conductive structures;
   a staircase structure having steps comprising edges of at least some of the conductive structures of the stack structure;
   an etch stop material continuously extending over the conductive structures and at least partially defining horizontal boundaries of the air gaps; and
   insulative material over the etch stop material.

2. The microelectronic device of claim 1, wherein the insulative material comprises:
   a first insulative material on the etch stop material; and
   a second insulative material on the first insulative material and having a different material composition than the first insulative material.

3. The microelectronic device of claim 1, wherein the etch stop material comprises a dielectric material having a different material composition than the insulative material.

4. The microelectronic device of claim 1, etch stop material comprises one or more of a high-k dielectric oxide material and a dielectric oxynitride material.

5. The microelectronic device of claim 4, wherein the insulative material comprises a dielectric nitride material.

6. The microelectronic device of claim 1, wherein the horizontal boundaries of the air gaps are offset from horizontal boundaries of the conductive structures most proximate thereto.

7. The microelectronic device of claim 1, wherein the horizontal boundaries of one or more of the air gaps are substantially coplanar with horizontal boundaries of one or more the conductive structures most proximate thereto.

8. The microelectronic device of claim 1, wherein portions of the etch stop material physically contact and horizontally extend across and upper surfaces and lower surfaces of the conductive structures.

9. The microelectronic device of claim 1, wherein the etch stop material has a thickness within a range of from about 1 nanometer (nm) to about 5 nm.

10. The microelectronic device of claim 1, wherein an inner lateral boundary of the insulative material is substantially non-planar.

11. A microelectronic device, comprising:
a stack structure comprising a vertically alternating sequence of conductive structures and air gaps arranged in tiers, each of the tiers comprising one of the conductive structures vertically neighboring one of the air gaps;
a staircase structure having steps comprising horizontal ends of at least some of the tiers of the stack structure; and
insulative material formed over the stack structure and the staircase structure, portions of the insulative material within vertical boundaries of the air gaps and inwardly horizontally projecting past outer horizontal boundaries of the conductive structures.

12. The microelectronic device of claim 11, wherein the an inner horizontal boundary of each of portions of the insulative material is horizontally offset from an outer horizontal boundary of at least one of the conductive structures most proximate thereto by a distance within a range of from about 10 nanometers (nm) to about 20 nm.

13. The microelectronic device of claim 11, further comprising an etch stop material interposed between the tiers of the stack structure and the insulative material, the etch stop material comprising additional insulative material having a different material composition than the insulative material.

14. A method of forming a microelectronic device comprising:
forming a preliminary stack structure comprising insulative structures and sacrificial structures vertically alternating with the insulative structures;
conformally depositing an etch stop material over exposed surfaces of the insulative structures and sacrificial structures;
forming insulative material over exposed surfaces of the etch stop material, the insulative material having a different material composition than the etch stop material;
replacing the sacrificial structures with conductive structures after forming the insulative material; and
at least partially removing the insulative structures, after replacing the sacrificial structures with conductive structures, to form a stack structure comprising air gaps vertically alternating with the conductive structures.

15. The method of claim 14, further comprising horizontally recessing the one of the sacrificial structures and the insulative structures relative to the other of the sacrificial structures and the insulative structures prior to conformally depositing the etch stop material.

16. The method of claim 14, wherein forming insulative material over exposed surfaces of the etch stop material comprises:
conformally depositing a first insulative material over the exposed surfaces of the etch stop material; and
non-conformally depositing a second insulative material over the exposed surfaces of the first insulative material.

17. The method of claim 14, wherein conformally depositing an etch stop material comprises conformally depositing one or more of a high-k dielectric oxide material and a dielectric oxynitride material.

18. The method of claim 14, wherein conformally depositing an etch stop material comprises conformally depositing one or more of a high-k dielectric oxide material and a dielectric oxynitride material.

19. A memory device, comprising:
a stack structure comprising tiers each comprising a conductive structure and an air gap vertically neighboring the conductive structure;
a staircase structure having steps comprising horizontal ends of the tiers of the stack structure;
a first dielectric material continuously extending over boundaries the stack structure and the staircase structure;
a second dielectric material on the first dielectric material;
a memory array comprising strings of memory cells vertically extending through the stack structure;
a source structure vertically underlying the stack structure and in electrical communication with the strings of memory cells; and
digit line structures vertically overlying the stack structure and in electrical communication with the strings of memory cells.

20. The memory device of claim 19, further comprising control logic circuitry underlying the stack structure and in electrical communication with the strings of memory cells.

21. The memory device of claim 19, wherein the first dielectric material extends into the air gaps of the tiers of the stack structure.

22. The memory device of claim 19, wherein the first dielectric material defines lateral boundaries of the air gaps of the tiers of the stack structure.

23. The memory device of claim 19, wherein, for an individual one of the tiers of the stack structure, a lateral boundary of one of the air gaps is horizontally offset from a lateral boundary of one of the conductive structures.

24. An electronic system, comprising:
an input device;
an output device;
a processor device operably connected to the input device and the output device; and
a memory device operably connected to the processor device and comprising:
a stack structure comprising a vertically alternating sequence of conductive material and air gaps arranged in tiers, the stack structure comprising one or more staircase structures having steps comprising portions of the conductive material of the tiers;
an etch stop material formed over the stack structure, the etch stop material substantially matching a topography of a lateral side of the one or more staircase structures; and
an insulative material formed over the etch stop material.

* * * * *

UNITED STATES PATENT AND TRADEMARK OFFICE
CERTIFICATE OF CORRECTION

PATENT NO. : 12,052,862 B2
APPLICATION NO. : 17/549237
DATED : July 30, 2024
INVENTOR(S) : Byeung Chul Kim and Shyam Surthi It is certified that error appears in the above-identified patent and that said Letters Patent is hereby corrected as shown below:

On the Title Page

Please delete the Title page and insert the attached Title page showing the corrected number of claims.

In the Claims

Replace Column 16, Line 41-Column 18, Line 65, (approx.) with following Claims:

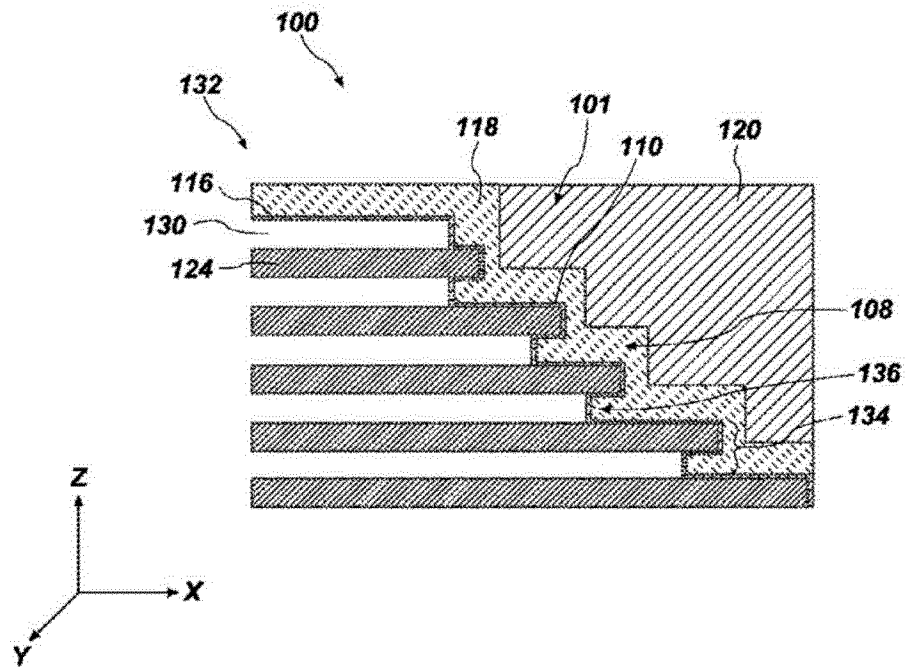

Claims

1. A microelectronic device comprising:
a stack structure comprising:
    conductive structures; and
    air gaps vertically alternating with the conductive structures;
a staircase structure having steps comprising edges of at least some of the conductive structures
    of the stack structure;
an etch stop material continuously extending over the conductive structures and at least partially
    defining horizontal boundaries of the air gaps; and
insulative material over the etch stop material.

2. The microelectronic device of claim 1, wherein the insulative material comprises:
a first insulative material on the etch stop material; and
a second insulative material on the first insulative material and having a different material
    composition than the first insulative material.

3. The microelectronic device of claim 1, wherein the etch stop material comprises a
dielectric material having a different material composition than the insulative material.

4. The microelectronic device of claim 1, etch stop material comprises one or more of a
high-k dielectric oxide material and a dielectric oxynitride material.

Signed and Sealed this
    Third Day of December, 2024

Katherine Kelly Vidal
*Director of the United States Patent and Trademark Office*

5. The microelectronic device of claim 4, wherein the insulative material comprises a dielectric nitride material.

6. The microelectronic device of claim 1, wherein the horizontal boundaries of the air gaps are offset from horizontal boundaries of the conductive structures most proximate thereto.

7. The microelectronic device of claim 1, wherein the horizontal boundaries of one or more of the air gaps are substantially coplanar with horizontal boundaries of one or more the conductive structures most proximate thereto.

8. The microelectronic device of claim 1, wherein portions of the etch stop material physically contact and horizontally extend across and upper surfaces and lower surfaces of the conductive structures.

9. The microelectronic device of claim 1, wherein the etch stop material has a thickness within a range of from about 1 nanometer (nm) to about 5 nm.

10. The microelectronic device of claim 1, wherein an inner lateral boundary of the insulative material is substantially non-planar.

11. A microelectronic device, comprising:
a stack structure comprising a vertically alternating sequence of conductive structures and air gaps arranged in tiers, each of the tiers comprising one of the conductive structures vertically neighboring one of the air gaps;
a staircase structure having steps comprising horizontal ends of at least some of the tiers of the stack structure; and
insulative material formed over the stack structure and the staircase structure, portions of the insulative material within vertical boundaries of the air gaps and inwardly horizontally projecting past outer horizontal boundaries of the conductive structures.

12. The microelectronic device of claim 11, wherein the an inner horizontal boundary of each of portions of the insulative material is horizontally offset from an outer horizontal boundary of at least one of the conductive structures most proximate thereto by a distance within a range of from about 10 nanometers (nm) to about 20 nm.

13. The microelectronic device of claim 11, further comprising an etch stop material interposed between the tiers of the stack structure and the insulative material, the etch stop material comprising additional insulative material having a different material composition than the insulative material.

14. A method of forming a microelectronic device comprising:
forming a preliminary stack structure comprising insulative structures and sacrificial structures vertically alternating with the insulative structures;
conformally depositing an etch stop material over exposed surfaces of the insulative structures and sacrificial structures;
forming insulative material over exposed surfaces of the etch stop material, the insulative material having a different material composition than the etch stop material;
replacing the sacrificial structures with conductive structures after forming the insulative material; and
at least partially removing the insulative structures, after replacing the sacrificial structures with conductive structures, to form a stack structure comprising air gaps vertically alternating with the conductive structures.

15. The method of claim 14, further comprising horizontally recessing the one of the sacrificial structures and the insulative structures relative to the other of the sacrificial structures and the insulative structures prior to conformally depositing the etch stop material.

16. The method of claim 14, wherein forming insulative material over exposed surfaces of the etch stop material comprises:
conformally depositing a first insulative material over the exposed surfaces of the etch stop material; and
non-conformally depositing a second insulative material over the exposed surfaces of the first insulative material.

17. The method of claim 14, wherein conformally depositing an etch stop material comprises conformally depositing one or more of a high-k dielectric oxide material and a dielectric oxynitride material.

18. A memory device, comprising:
a stack structure comprising tiers each comprising a conductive structure and an air gap vertically neighboring the conductive structure;
a staircase structure having steps comprising horizontal ends of the tiers of the stack structure;
a first dielectric material continuously extending over boundaries the stack structure and the staircase structure;
a second dielectric material on the first dielectric material;
a memory array comprising strings of memory cells vertically extending through the stack structure;
a source structure vertically underlying the stack structure and in electrical communication with the strings of memory cells; and
digit line structures vertically overlying the stack structure and in electrical communication with the strings of memory cells.

19. The memory device of claim 18, further comprising control logic circuitry underlying the stack structure and in electrical communication with the strings of memory cells.

20. The memory device of claim 18, wherein the first dielectric material extends into the air gaps of the tiers of the stack structure.

21. The memory device of claim 18, wherein the first dielectric material defines lateral boundaries of the air gaps of the tiers of the stack structure.

22. The memory device of claim 18, wherein, for an individual one of the tiers of the stack structure, a lateral boundary of one of the air gaps is horizontally offset from a lateral boundary of one of the conductive structures.

23. An electronic system, comprising:
an input device;
an output device;
a processor device operably connected to the input device and the output device; and
a memory device operably connected to the processor device and comprising:
    a stack structure comprising a vertically alternating sequence of conductive material and air gaps arranged in tiers, the stack structure comprising one or more staircase structures having steps comprising portions of the conductive material of the tiers;
    an etch stop material formed over the stack structure, the etch stop material substantially matching a topography of a lateral side of the one or more staircase structures; and
    an insulative material formed over the etch stop material.

(12) United States Patent
Kim et al.

(10) Patent No.: US 12,052,862 B2
(45) Date of Patent: Jul. 30, 2024

(54) MICROELECTRONIC DEVICES INCLUDING STACK STRUCTURES HAVING AIR GAPS, AND RELATED MEMORY DEVICES, ELECTRONIC SYSTEMS, AND METHODS

(71) Applicant: Micron Technology, Inc., Boise, ID (US)

(72) Inventors: Byeung Chul Kim, Boise, ID (US); Shyam Surthi, Boise, ID (US)

(73) Assignee: Micron Technology, Inc., Boise, ID (US)

(*) Notice: Subject to any disclaimer, the term of this patent is extended or adjusted under 35 U.S.C. 154(b) by 318 days.

(21) Appl. No.: 17/549,237

(22) Filed: Dec. 13, 2021

(65) Prior Publication Data
US 2023/0189515 A1    Jun. 15, 2023

(51) Int. Cl.
| | |
|---|---|
| H01L 27/11556 | (2017.01) |
| G11C 5/02 | (2006.01) |
| H01L 23/538 | (2006.01) |
| H10B 41/27 | (2023.01) |
| H10B 43/27 | (2023.01) |

(52) U.S. Cl.
CPC ........... *H10B 41/27* (2023.02); *G11C 5/025* (2013.01); *H01L 23/5386* (2013.01); *H10B 43/27* (2023.02)

(58) Field of Classification Search
CPC ..... G11C 5/025; H01L 23/5386; H10B 41/27; H10B 43/50; H10B 43/27
See application file for complete search history.

(56) References Cited

U.S. PATENT DOCUMENTS

| | | | |
|---|---|---|---|
| 10,002,787 B2* | 6/2018 | Yu | H01L 21/76834 |
| 2018/0330985 A1* | 11/2018 | Yu | H10B 43/50 |
| 2021/0343736 A1* | 11/2021 | Surthi | G11C 5/025 |
| 2022/0278051 A1* | 9/2022 | Scarbrough | H10B 43/27 |

* cited by examiner

Primary Examiner — Jaehwan Oh
(74) Attorney, Agent, or Firm — TraskBritt

(57) ABSTRACT

A microelectronic device comprises a stack structure, a staircase structure, an etch stop material, and insulative material. The stack structure comprises conductive structures, and air gaps vertically alternating with the conductive structures. The staircase structure is within the stack structure and has steps comprising edges of at least some of the conductive structures of the stack structure. The etch stop material continuously extends over the conductive structures and at least partially defines horizontal boundaries of the air gaps. The insulative material overlies the etch stop material. Additional microelectronic devices, memory devices, electronic systems, and methods are also disclosed.

23 Claims, 11 Drawing Sheets